United States Patent [19]

Olsen

[11] 4,087,744

[45] May 2, 1978

[54] DEVICE FOR DETERMINING A HIGH-VOLTAGE POTENTIAL IN METAL-ENCAPSULATED HIGH-VOLTAGE SWITCHING INSTALLATIONS AND EQUIPMENT

[75] Inventor: Willi Olsen, Berlin, Germany

[73] Assignee: Siemens Aktiengesellschaft, Munich, Germany

[21] Appl. No.: 734,671

[22] Filed: Oct. 21, 1976

[30] Foreign Application Priority Data

Oct. 24, 1975 Germany ............................ 2548173

[51] Int. Cl.² ...................... G01R 31/02; G01R 19/00
[52] U.S. Cl. ........................................ 324/51; 324/126; 324/133
[58] Field of Search .................. 324/51, 54, 126, 127, 324/133; 340/214, 253 R

[56] References Cited

U.S. PATENT DOCUMENTS

| 3,425,049 | 1/1969 | Robinson | 324/133 X |
| 3,524,178 | 8/1970 | Stratton | 324/133 X |
| 3,639,833 | 2/1972 | Tachick | 324/133 X |
| 3,701,944 | 10/1972 | Amalric | 324/126 |
| 3,735,248 | 5/1973 | Reese | 324/133 X |
| 3,970,932 | 7/1976 | Harvey | 324/133 |

FOREIGN PATENT DOCUMENTS

| 339,835 | 8/1934 | Germany | 324/126 |
| 301,854 | 12/1954 | Switzerland | 324/126 |
| 629,162 | 9/1949 | United Kingdom | 324/54 |

Primary Examiner—Gerard R. Strecker
Attorney, Agent, or Firm—Kenyon & Kenyon, Reilly, Carr & Chapin

[57] ABSTRACT

A measuring device for determining the voltage on the conductor of a metal-encapsulated high-voltage switching installation is disclosed. The measuring device includes an electrode disposed between the conductor and the encapsulation of the switching installation which delivers an electrical signal to a measuring circuit. In accord with the invention the measuring device is further provided with a test circuit which comprises the electrode, two separated electrode terminals and a current-sensitive measuring or indicating member.

3 Claims, 1 Drawing Figure

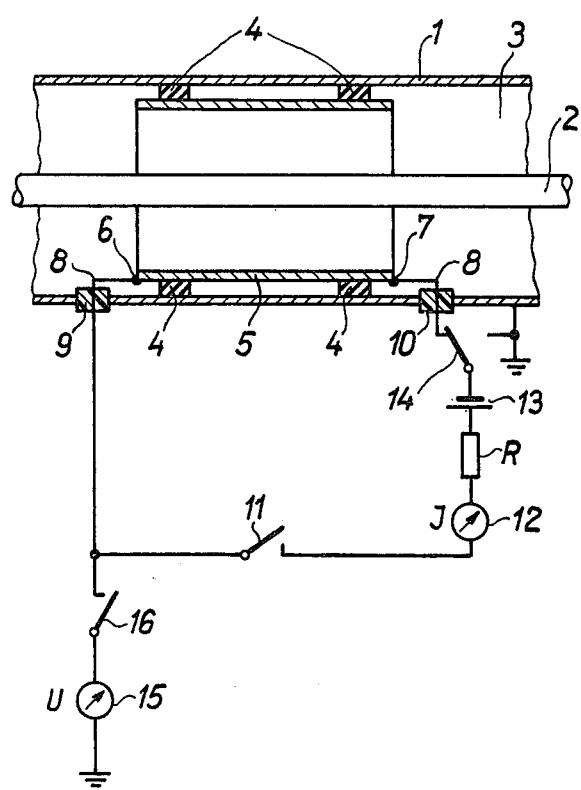

DEVICE FOR DETERMINING A HIGH-VOLTAGE POTENTIAL IN METAL-ENCAPSULATED HIGH-VOLTAGE SWITCHING INSTALLATIONS AND EQUIPMENT

BACKGROUND OF THE INVENTION

1. Field of the Invention

The invention relates to a device for determining the high-voltage potential on the high-voltage conductor of a metal-encapsulated high-voltage switching installation wherein the high-voltage conductor is supported by the grounded encapsulation of the installation by bodies of insulating material.

2. Description of the Prior Art

Measuring devices of the above type are known in the prior art. Such devices typically include an electrode which is arranged between and insulated from the high-voltage conductor and the grounded encapsulation and which generates a signal for a measuring circuit. In particular, such an electrode can serve as the high-potential capacitor of capacitive voltage divider. In a somewhat different arrangement of this kind, the signal from the electrode is used to control the on-off position of an electric switch gear arranged within the encapsulation.

In either case, an interruption of the line carrying the electrode signal to the measuring circuit leads to faulty information which, while undesirable, is permissible for voltage measurement, but is not permissible for voltage checking, which is used to ensure the safety of the maintenance and operating personnel of the switching installation. More particularly, in the case of a capacitive voltage divider system, a fault in the form of a line interruption leads to an incorrect signal regarding the operating condition. Moreover, in a switch position-indicating system, the electrode and the measuring circuit cannot be readily designed so that an interruption of the signal transmission line leading from the electrode can be recognized unequivocally in the measuring circuit. Thus, if the switch is a grounding switch and the electrode signal lifts or puts in operation the necessary interlock, no unequivocal statement regarding the presence of a high-voltage potential can be obtained in the case of a line interruption without further tests being taken. In VDE Specification 0105 Part 1, Item 7, several tests must be carried out to establish and ensure the voltage-free condition prior to the start of work and acceptance of the work.

It is an object of the present invention to provide an improved high-voltage measuring device of the above-type.

SUMMARY OF THE INVENTION

In accordance with the principles of the present invention, the above and other objectives are accomplished in a measuring device of the above-type by further providing therein, in addition to an electrode and measuring circuit, a test circuit which includes the electrode, two physically separated electrode terminals, and a current-sensitive measuring or indicating means.

With the measuring device configured as above-described, it is possible to either operate the test circuit before and after the evaluation of the electrical signal derived from the electrode, or to switch-on the test circuit simultaneously with the measuring circuit and while a signal is being generated by the electrode. As a result, a break in the line between the electrode and measuring circuit, which would have incorrectly lead to a signal corresponding to the voltage-less condition of the high-voltage switching installation, is no longer possible, i.e., the measuring circuit itself is now designed so that it can be checked for operability.

Where automatic control of the drive for a grounding switch or the like is desired, the measuring or indicating means of the test circuit controls the measuring circuit preferably so that an output signal of the measuring circuit is given off if and only if a test current flows. This ensures that when a line break occurs control of the drive takes place in such a manner that the locking of the off position of the grounding switch is maintained.

In a further aspect of the invention, if it is desired to ascertain with the measuring device not only line interruptions, but also short circuits, for example, in the region of the feedthroughs situated in the encapsulation and through which pass electrical lines associated with the two electrode terminals, a further test circuit can advantageously be provided which includes the electrode, both electrode terminals and their feedthroughs and which controls the measuring circuit so that an output signal of the measuring circuit is given off if and only if no current flows through the further test circuit.

BRIEF DESCRIPTION OF THE DRAWINGS

The above and other features and aspects of the present invention will become apparent upon reading the following detailed description in conjunction with the accompanying drawing, in which:

FIG. 1 shows a measuring device in accordance with the principles of the present invention.

DETAILED DESCRIPTION

FIG. 1 shows schematically a high-voltage switching installation which contains a metallic encapsulation 1, preferably, of tubular design. The encapsulation 1 encloses a centrally disposed high-voltage conductor 2, which is braced against the encapsulation 1 by means of bodies of insulating material (not shown). In the interior space 3 between the conductor 2 and the encapsulation 1, a gaseous medium, particularly sulfur hexafluoride, is provided as an insulating medium and is maintained at a pressure of, for example, 4 bar.

The encapsulation 1 carries via supports of insulating material 4 an electrode 5 which has the shape of a hollow cylinder and is in surrounding spaced relationship to the conductor 2. The electrode 5 has terminals at two physically separated points 6 and 7. These terminals are connected via lines 8 and feedthroughs 9, 10 to a test circuit. More particularly, the test circuit includes the electrode 5, the terminal 6, a switch 11, a measuring instrument 12, a resistor R, a d-c voltage source 13, a double-throw switch 14, and the terminal 7. In the position of the double-throw switch 14 illustrated in the figures, there flows, if the switch 11 is closed, in the test circuit a current which makes it possible to check for line interruptions in the regions of the electrode terminals 6 and 7 between the electrode measuring circuit comprising a voltage indicator 15 and a switch 16. If the current flows in the test circuit then this indicates the absence of line interruptions and that the signal voltage being read by the indicator 15 when the switch 16 is closed is a true indication of whether conductor 2 carries high voltage or not.

In order to detect short circuits in the region of the feedthroughs 9 and 10, which would cause an electrical connection between the electrode 5 and the grounded encapsulation 1, and therefore, regardless of the presence of high-voltage potential, a null-potential at all times at the indicating instrument 15, the double-throw switch 14 is transferred into its other position. This permits a resistance measurement between the encapsulation 1 and the electrode 5 to be made. Only if this resistance measurement indicates that no short circuit is present and only if in the position shown of the double-throw switch 14, the test circuit carries current, can it be concluded from a null-potential indication of the instrument 15 that actually no high-voltage potential is present at the conductor 2.

It is, of course, also possible within the scope of the invention to superimpose on the measuring signal taken from the electrode 5 a test current signal which may be different, for instance, as to frequency, and by which a line break as well as also a short circuit can be detected unequivocally by appropriate calibration. It is furthermore possible to largely combine the test circuit and the measuring circuit in one circuit containing the measuring and the checking signal.

What is claimed is:

1. Apparatus for determining the high voltage potential on a conductor of a high voltage switching installation, the conductor carrying a high voltage and being supported by bodies of insulating material within a grounded metallic encapsulation, the apparatus comprising:
   a measuring circuit;
   an electrode disposed between the conductor and the encapsulation for delivering an electrical signal related to the potential on said conductor to said measuring circuit, said electrode including first and second electrode terminals situated at the ends thereof;
   and test circuit means including:
   first and second test circuit terminals, said second test circuit terminal being connected to said second electrode terminal;
   a circuit connected between said first and second test circuit terminals and including a source of energy and a current-sensitive means for providing an indication of current flow through said circuit
   and switch means for selectively connecting said first test circuit terminal to said first electrode terminal and to said encapsulation whereby current flow through said circuit when said switch means connects said first test circuit terminal to said first electrode terminal provides an indication that said electrode is not in open circuit condition and the absence of current flow through said circuit when said switch means connects said first test circuit terminal to said encapsulation provides an indication that said electrode is not in a short circuit condition.

2. Apparatus in accordance with claim 1 in which: said measuring circuit is connected to deliver
   an output only if said current-sensitive means senses current flow and no current flow, respectively, when said first test circuit terminal is connected to said first electrode terminal and to said encapsulation.

3. Apparatus in accordance with claim 1 further comprising:
   first and second feed-throughs disposed in said encapsulation;
   and first and second leads extending through said first and second feed-throughs, respectively, said first lead being connected between said first electrode terminal and said switch means and said second lead being connected between said second electrode terminal and said second test circuit terminal.

* * * * *